United States Patent [19]

Jeng

[11] Patent Number: 4,679,246
[45] Date of Patent: Jul. 7, 1987

[54] ONE-SHOT TUNING CIRCUIT

[75] Inventor: Tzong K. Jeng, North Canton, Ohio

[73] Assignee: General Electric Company, Portsmouth, Va.

[21] Appl. No.: 729,336

[22] Filed: May 1, 1985

[51] Int. Cl.⁴ ............................................. H04B 1/16
[52] U.S. Cl. .................................. 455/183; 455/185; 455/186
[58] Field of Search ............... 455/183, 186, 182, 185, 455/164, 165, 184

[56] References Cited

U.S. PATENT DOCUMENTS

| | | |
|---|---|---|
| 4,123,724 | 10/1978 | Das et al. . |
| 4,207,531 | 6/1980 | Ito . |
| 4,234,929 | 11/1980 | Riley, Jr. ............................ 455/183 |
| 4,280,149 | 7/1981 | Skerlos . |
| 4,298,988 | 11/1981 | Dages . |
| 4,352,205 | 9/1982 | Kato et al. . |
| 4,355,414 | 10/1982 | Inoue .................................. 455/184 |
| 4,402,089 | 8/1983 | Knight et al. . |
| 4,408,349 | 10/1983 | Yukawa . |
| 4,419,769 | 12/1983 | Cohen . |
| 4,542,533 | 9/1985 | Parker ................................. 455/182 |

FOREIGN PATENT DOCUMENTS 0061839 5/1981 Japan .................................. 455/183

Primary Examiner—Robert L. Griffin
Assistant Examiner—Curtis Kuntz

[57] ABSTRACT

A one-shot tuning system for microprocessor controlled tuning systems uses a table look-up (105) to provide an offset value in response to a deviation error in the intermediate frequency of the tuner. This offset value is loaded into the programmable frequency divider (101) of the tuner to complete the tuning process.

3 Claims, 5 Drawing Figures

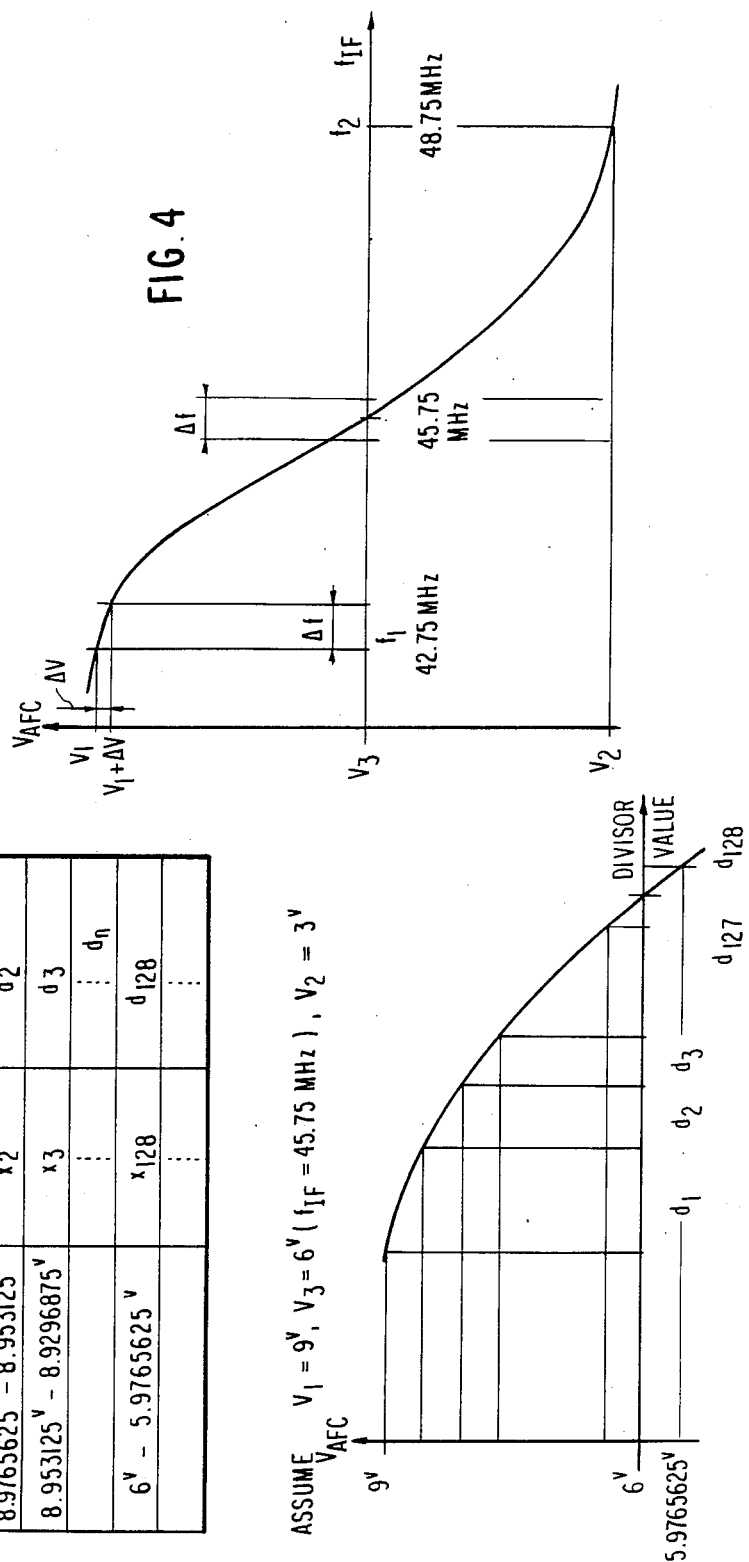

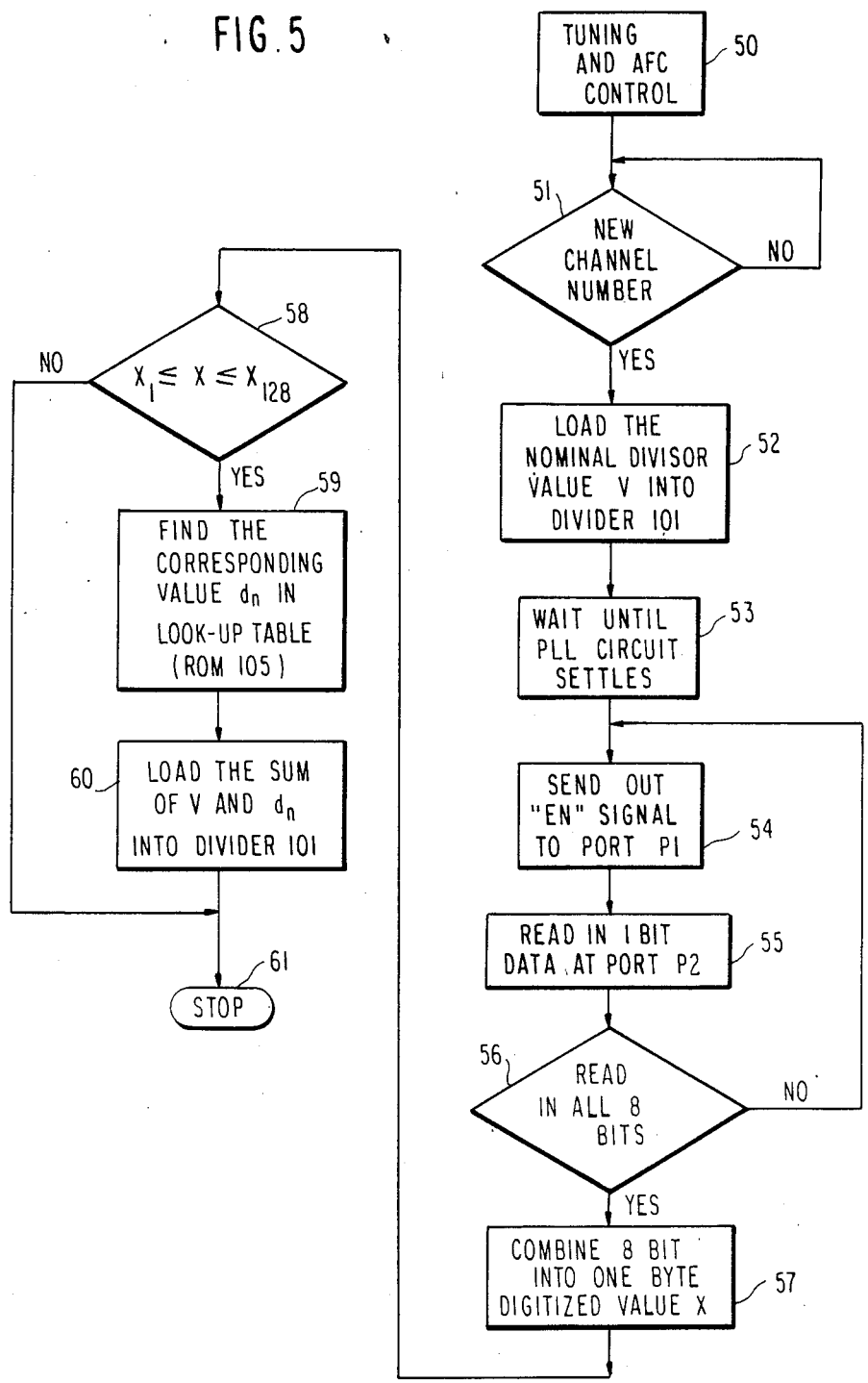

ONE-SHOT TUNING CIRCUIT

DESCRIPTION

1. Field of the Invention

This invention generally relates to electronic tuning circuits for radios, televisions and the like, and, more particularly, to a microprocessor controlled tuning circuit which performs the tuning operation in a short time.

2. Description of the Prior Art

Microprocessor controlled tuning systems are widely used in radio and television receivers. Typically, a microprocessor responds to a user input to provide frequency data to a phase-locked loop (PLL). This frequency data is loaded into a programmable frequency divider in the PLL to determine the nominal frequency of a voltage controlled oscillator (VCO) in a tuner. An automatic frequency control (AFC) detector in an intermediate frequency circuit provides an error voltage output to an input of the PLL which adjusts the output frequency of the VCO to reduce the error voltage to zero. In practice, this process is repeated several times before the error voltage is reduced to zero with the result that the desired station or channel has been properly selected for reception.

It is generally desirable to speed up the tuning process and thereby enhance the performance of microprocessor controlled tuning circuits. One approach to improving the tuning process is disclosed in U.S. Pat. No. 4,542,533 by James S. Parker and assigned to the assignee of this application. According to the Parker invention, the AFC circuit comprises an RC time constant network, a comparator circuit, an AFC detector circuit, and the microprocessor which is used for controlling the tuner. The RC time constant network preferably takes the form of a series resistance and capacitance connected between a source of charging voltage and ground. One port of the microprocessor is connected in common to the junction between the resistance and capacitance and one input of the comparator. The other input of the comparator is connected to the output of the AFC detector. Initially, the one port of the microprocessor is set low which holds the output of the comparator at a low voltage. To start the AFC process, the one port of the microprocessor is set to its high impedance state so that the capacitance charges through the resistance causing the voltage at the first input of the comparator to rise in an approximately linear manner. As the voltage rises, the microprocessor alternately reads a second port which is connected to the output of the comparator and increments a counter. When the voltage at the first input of the comparator rises above the AFC voltage at the second input from the AFC detector, the comparator output goes high and counting is stopped. The number held in the counter is proportional to the AFC voltage and is therefore proportional to the present tuning error. From this error number, the proper PLL divide ratio is obtained and the VCO is set to the corrected frequency. This system is effective to tune the desired station or channel with only one AFC detector reading and VCO adjustment.

SUMMARY OF THE INVENTION

It is therefore an object of the present invention to provide an improved automatic frequency control which provides a faster response compared to the present AFC techniques which use an iterative procedure to search for the proper frequency.

It is another object of the invention to provide an improved automatic tuning control which exhibits fast response and makes increased use of integrated circuit technology to thereby lower the cost of manufacture.

According to the present invention, a table look-up in the form of a read only memory (ROM) is used in the tuning loop to provide very fast tuning. The microprocessor loads the divisor value in the programmable frequency divider whenever a new station or channel is selected, and when the PLL settles down, the microprocessor checks the intermediate frequency (IF) and goes to the table look-up to find the offset value between the current IF and the designed IF. The microprocessor then loads the offset value in the programmable frequency divider of the PLL to finish the tuning operation.

BRIEF DESCRIPTION OF THE DRAWINGS

Other objects, aspects and advantages of the invention will be better understood from the following detailed description of the invention with reference to the drawings, in which:

FIG. 2 is a table showing the relationship of the AFC error voltage, its digitized value, and the corresponding divisor value stored in the table look-up;

FIG. 3 is a graph illustrating, for a specific example, the relation of the AFC error voltages and the divisor values in the table of FIG. 2;

FIG. 4 is a graph illustrating the tuning process; and

FIG. 5 is a flow chart illustrating the program of the microprocessor of the one-shot tuning system shown in FIG. 1.

DETAILED DESCRIPTION OF A PREFERRED EMBODIMENT OF THE INVENTION

Figure 1:
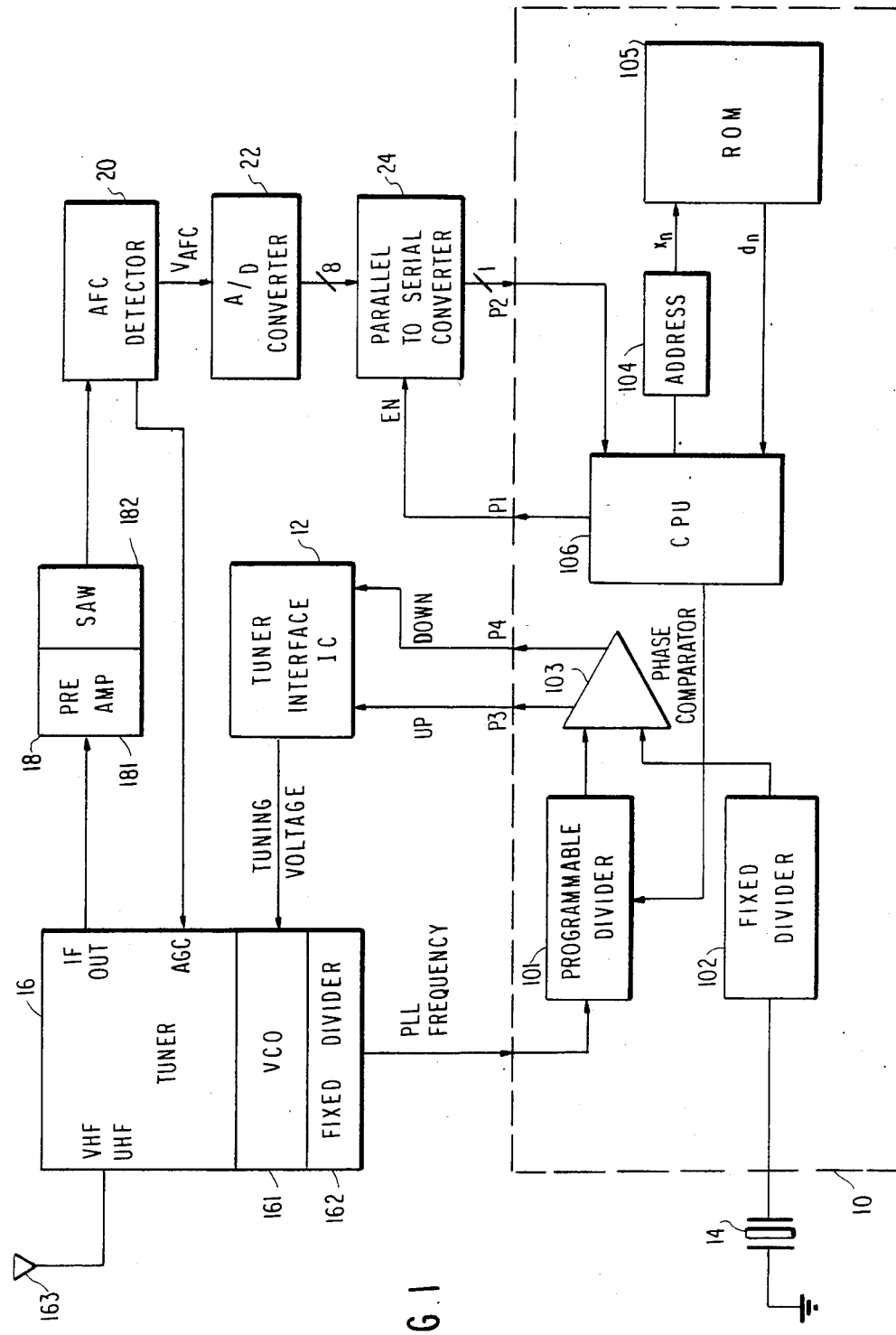
FIG. 1 is a block diagram of the one-shot tuning system according to the invention.

Referring now to the drawings, and more particularly to FIG. 1, the invention is illustrated in block diagram form as comprising a microprocessor 10 which may be implemented with any of several commercially available integrated circuit microprocessors. The microprocessor 10 includes two frequency dividers 101 and 102. The first of these, that is frequency divider 101, receives as its input the PLL frequency and divides that frequency by a factor loaded by the microprocessor in response to a user input. Frequency divider 102, on the other hand, receives the frequency of a stable frequency source, such as a crystal 14, and divides that frequency by a predetermined factor. The divided frequencies from each of these frequency dividers are compared in a phase comparator 103 to produce a control voltage. This control voltage may be supplied via either of two output ports P3 or P4 of the microprocessor 10 to a tuner interface integrated circuit (IC) 12. As illustrated in the figure, the output from port P3 is an up command, and the output from port P4 is a down command. The tuner interface 12 produces a tuning voltage which is supplied to the VCO 161 in the tuner 16. The VCO frequency is divided by a predetermined factor in frequency divider 162 to scale the VCO frequency for the frequency of the crystal 14 being used. The scaled VCO frequency is the PLL frequency which is then fed back to programmable frequency divider 101.

What has been thus far described is a conventional microprocessor controlled PLL tuning system. As is also conventional, the tuner 16 is connected to a source of radio frequency (RF) which may be an antenna 163 as shown or a cable such as is used in a CATV system. The IF output of the tuner 16 is supplied to a buffer circuit 18 which, as shown in FIG. 1, may include a preamplifier 181 and a surface acoustic wave (SAW) filter 182. The output of the filter 182 is supplied to an AFC detector 20 which generates both an automatic gain control voltage (AGC) and an AFC voltage. The AGC voltage is fed back to the tuner 16 to control the gain of the IF amplifier stages of the tuner. Obviously, depending on the design of the tuner 16 and the specific application, the buffer 18 may consist of only a buffer amplifier stage and no filter, or may use an inductance and capacitance filter of conventional design rather than the SAW filter 182. In some applications, it may be possible to dispense with the buffer 18 and provide a direct connection between the IF output of the tuner 16 and the AFC detector 20.

According to the invention, the AFC voltage from the AFC detector 20 is converted to a digital number by an analog-to-digital (A/D) converter 22. The A/D converter may be implemented with any one of several commercially available IC A/D converters. The parallel output of the A/D converter 22 is temporarily stored, and when the microprocessor 10 generates an enable signal at output port $P_1$, this parallel output is converted to a serial output with the parallel-to-serial converter 24 and read into input port $P_2$ of the microprocessor 10. This digital number is loaded by the central processing unit (CPU) 106 of the microprocessor 10 into the addressing circuits 104 of the ROM 105. The ROM 105 stores divisor values which are correlated with the digitized values of the AFC detector voltage as shown in the table of FIG. 2. In other words, the digitized value $x_i$ is the address supplied by the addressing circuits 104 to the ROM 105, and the output of the ROM 105 is the divisor value $d_i$ which is loaded by the CPU 106 in the programmable frequency divider 101. The relationship of the AFC detector voltage and the divisor values stored in the ROM 105 is shown in FIG. 3 of the specific example of a designed IF of 45.75 MHz typically used in most television tuners.

The process of one-shot tuning according to the invention is as follows. First, the microprocessor 10 loads the divisor value into the programmable frequency divider 101 whenever a new station or channel is selected. The microprocessor then waits for several hundred milliseconds for the PLL circuit to settle down. When the PLL has settled, the microprocessor 10 sends out the enable signal from port $P_1$ to the parallel-to-serial converter 24 and reads the digitized AFC voltage data into port $P_2$. This data is read into the addressing circuits 104 to read the table look-up ROM 105 in order to find the offset value between the current IF frequency and the designed IF frequency; e.g., 45.75 MHz for television tuners. The microprocessor 10 then loads the offset value into the programmable frequency divider 101 to finish the tuning operation.

This process is illustrated in FIG. 4 for the specific example where the maximum allowable deviation from the designed IF of 45.75 MHz is 3 MHz. Thus, as shown in FIG. 4, $f_2-f_1=6$ MHz. The A/D converter 22 resolution is assumed to be 8-bits. This provides a frequency resolution of 6 Mhz/$2^8$ or 23.4375 KHz. This is the minimum value of $\Delta f$ shown in the figure. Assume that $v_1-v_2$ is equal to 6 volts, then the resolution of the AFC detector voltage is equal to 6 volts/$2^8$ or 0.0234375 volts. This performance is quite good and, because of the use of the table look-up ROM 105, the speed of the tuning circuit is greatly enhanced while at the same time reducing the cost of manufacture.

FIG. 5 is the flow chart for the microprocessor program. The program begins with the block 50 for tuning and AFC control. The first step, indicated by decision block 51, is to check to see if a new channel number has been entered. If not, the process waits by periodically checking for the entry of a new channel number. On the other hand if a new channel number is detected, the nominal divisor value is loaded into the frequency divider 101 as indicated in block 52. The process then waits in block 53 for the PLL to settle. When the settling time period times out as determined by CPU 106, the enable signal is sent to port P1 to enable parallel-to-serial converter 24, as indicated by block 54. This causes, in block 55, the first bit of data to be read into port P2. Each time a bit of data is read into port P2, a determination is made in decision block 56 as to whether all bits have been read in. As shown in the figure, the assumption is made that there are eight bits of data, this being the number of bits output by many commercially available A/D converters. Until all bits of data have been read in, the process loops back to block 54 to again send out an enable signal to port P1. When all bits of data have been read into port P2, then the eight bits of input serial data are combined into one byte representing the digitized value x, as indicated in block 57. This digitized value x is compared in block 58 with minimum and maximum values to make sure that it is within in the range for tuning. If it is not, the program stops at block 61. Assuming, however, that the digitized value x is within the tuning range, the next step in block 59 is to find the corresponding value $d_n$ in the look up table stored in ROM 105. Finally, the sum of the nominal divisor value and $d_n$ are loaded into divider 101 to complete the tuning process, as indicated by block 60.

While the invention has been described in terms of a specific example applicable to a television tuner, those skilled in the art will recognize that the invention may be used in other and different applications. What the invention provides is good performance and low cost in microprocessor controlled PLL tuning circuits.

I claim:

1. In a microprocessor controlled phase locked loop tuning system of the type wherein the microprocessor is responsive to a user input station or channel selection to produce an output to a programmable frequency divider in the phase locked loop which determines the nominal local oscillator frequency and the intermediate frequency of the tuning system is detected to produce an error voltage indicative of the deviation of the intermediate frequency from a designed value, the improvement comprising:

analog-to-digital converter means for converting said error voltage to a digital number; and table look-up means addressed by said digital number for providing an offset value for loading in said programmable frequency divider, said programmable frequency divider thereafter providing an output which determines the final local oscillator frequency and the intermediate frequency of the tuning system to complete the tuning process.

2. A process for fast tuning of a microprocessor controlled phase locked loop tuner comprising the steps of:

loading a divisor in a programmable frequency divider of the phase locked loop in response to a user selection of a station or channel to be received, comparing a resulting intermediate frequency of the tuner with a design frequency to produce a deviation error, and using the deviation error to address a table look-up to find an offset divisor for loading in said programmable frequency divider, said programmable frequency divider thereafter providing an output which determines the final local oscillator frequency and the intermediate frequency of the tuning system to complete the tuning process.

3. A one-shot tuning system comprising:

tuner means including a voltage controlled oscillator for coverting a radio frequency input signal to an intermediate frequency signal;

phase locked loop means including a microprocessor responsive to a user input for loading a divisor in a programmable frequency divider to generate a control voltage for said voltage controlled oscillator;

detector means for comparing the intermediate frequency signal from said tuner means with a nominal frequency and generating an error signal; and table look-up means responsive to said error signal for reading out an offset value which is loaded by said microprocessor in said programmable frequency divider, said programmable frequency divider thereafter providing an output which determines the final local oscillator frequency and the intermediate frequency of the tuning system to complete the tuning process.

* * * * *